(12) United States Patent
Sasaki et al.

(10) Patent No.: US 7,507,292 B2
(45) Date of Patent: Mar. 24, 2009

(54) METHOD FOR PRODUCING GROUP III ELEMENT NITRIDE SINGLE CRYSTAL AND GROUP III ELEMENT NITRIDE TRANSPARENT SINGLE CRYSTAL PREPARED THEREBY

(75) Inventors: Takatomo Sasaki, Suita (JP); Yusuke Mori, Suita (JP); Masashi Yoshimura, Suita (JP); Fumio Kawamura, Suita (JP); Kunimichi Omae, Suita (JP); Tomoya Iwahashi, Osaka (JP); Masanori Morishita, Suita (JP)

(73) Assignee: Osaka Industrial Promotion Organization, Osaka (JP)

( * ) Notice: Subject to any disclaimer, the term of this patent is extended or adjusted under 35 U.S.C. 154(b) by 159 days.

(21) Appl. No.: 10/522,488

(22) PCT Filed: Jun. 30, 2003

(86) PCT No.: PCT/JP03/08258

§ 371 (c)(1),
(2), (4) Date: Jan. 26, 2005

(87) PCT Pub. No.: WO2004/013385

PCT Pub. Date: Feb. 12, 2004

(65) Prior Publication Data

US 2006/0051942 A1    Mar. 9, 2006

(30) Foreign Application Priority Data

| Jul. 31, 2002 | (JP) | ............................. 2002-223190 |
| Nov. 22, 2002 | (JP) | ............................. 2002-339875 |
| Dec. 27, 2002 | (JP) | ............................. 2002-382610 |
| Feb. 5, 2003 | (JP) | ............................. 2003-027888 |
| Mar. 20, 2003 | (JP) | ............................. 2003-078680 |
| Mar. 27, 2003 | (JP) | ............................. 2003-088482 |

(51) Int. Cl.
*C30B 11/06* (2006.01)
(52) U.S. Cl. ............................. 117/73; 117/68; 117/71; 117/74; 117/75; 117/76
(58) Field of Classification Search ................... 117/68, 117/71, 73, 74, 75, 76
See application file for complete search history.

(56) References Cited

U.S. PATENT DOCUMENTS

| 5,868,837 | A | * | 2/1999 | DiSalvo et al. .................. 117/2 |
| 6,001,748 | A | | 12/1999 | Tanaka et al. |
| 6,270,569 | B1 | | 8/2001 | Shibata et al. |

(Continued)

FOREIGN PATENT DOCUMENTS

CN         1288079         3/2001

(Continued)

OTHER PUBLICATIONS

Yano, et al., "Control of Nucleation Site and Growth Orientation of Bulk GaN Crystals". Jpn. J. Appl. Phys. vol. 38, Part 2. No. 10A, Oct. 1, 1999, pp. L1121-L1123.

(Continued)

*Primary Examiner*—Robert M Kunemund
(74) *Attorney, Agent, or Firm*—Hamre, Schumann, Mueller & Larson, P.C.

(57) ABSTRACT

A method for producing a Group III element nitride single crystal, which comprises reacting at least one Group III element selected from the group consisting of gallium(Ga), aluminum(Al) and indium(In) with nitrogen(N) in a mixed flux of sodium(Na) and at least one of an alkali metal (except Na) and an alkaline earth metal. The method allows the production, with a good yield, of the single crystal of a group III element nitride which is transparent, is reduced in the density of dislocation, has a bulk form, and is large. In particular, a gallium nitride single crystal produced by the method has high quality and takes a large and transparent bulk form, and thus has a high practical value.

24 Claims, 16 Drawing Sheets

U.S. PATENT DOCUMENTS

2002/0046695 A1     4/2002     Sarayama et al.
2002/0158267 A1*   10/2002   Kelsey, Jr. ................. 257/103

FOREIGN PATENT DOCUMENTS

| | | |
|---|---|---|
| EP | 0 811 708 | 12/1997 |
| EP | 1 278 233 | 1/2003 |
| JP | 2000-327495 | 11/2000 |
| JP | 2001-288000 | 10/2001 |
| JP | 2002-68897 | 3/2002 |
| JP | 2002-293696 | 10/2002 |
| WO | 01/24921 | 4/2001 |

OTHER PUBLICATIONS

Grzegory et al., "III-V Nitrides-Thermodynamics and Crystal Growth at High $N_2$ Pressure", Journal of Physics and Chemistry of Solids (1995); 56: 639-647.

Song et al., "Bulk GaN single crystals: growth conditions by flux method", Journal of Crystal Growth (2003); 247: 275-278.

Morishita et al., "Growth of bulk GaN single crystals in metal-sodium flux system", Journal of Japanese Association for Crystal Growth (2002); 29: 119-120.

Extended Abstracts (The 63rd Autumn Meeting, 2002); The Japan Society of Applied Physics No. 0 and No. 1.

Proceedings of the 47th Symposium of Synthetic Crystals, "LPE growth of GaN single crystal and LPE growth using Na-Ca-mixed flux", pp. 87-88.

Kawamura et al., "Synthesis of Bulk GaN Single Crystals Using Na-Ca Flux", Japanese Journal of Applied Physics (2002); 41: 1440-1442.

* cited by examiner

METHOD FOR PRODUCING GROUP III ELEMENT NITRIDE SINGLE CRYSTAL AND GROUP III ELEMENT NITRIDE TRANSPARENT SINGLE CRYSTAL PREPARED THEREBY

TECHNICAL FIELD

The present invention relates generally to a method for producing single crystal of a Group-III-element nitride.

BACKGROUND ART

Group-III-element nitride semiconductors have been used in the field of heterojunction high-speed electron devices or photoelectron devices (semiconductor lasers, light emitting diodes, sensors, etc.), for example. Among the Group-III-element nitride semiconductors, gallium nitride (GaN) in particular has been gaining attention. Heretofore, gallium nitride single crystal has been obtained by reacting gallium with nitrogen gas directly (J. Phys. Chem. Solids, 1995, 56, 639). In this case, however, an extremely high temperature of 1300° C. to 1600° C. and an extremely high pressure of 8000 to 17000 atm (about 800 to about 1700 MPa) are required. In order to solve this problem, a technique for growing gallium nitride single crystal in a sodium (Na) flux (hereinafter such a technique also is referred to as a "Na flux method") has been developed (e.g., U.S. Pat. No. 5,868,837). According to this method, it is possible to reduce the required heating temperature drastically to 600° C. to 800° C. and also the required pressure to about 50 atm (about 5 MPa). However, the single crystal obtained by this method is blackened, thereby posing a problem in quality. Furthermore, although the temperature and pressure required by this method are much lower than those required when producing the single crystal by reacting gallium with nitrogen gas directly, the conditions required by this method are still stringent, and there are demands for further reduction, especially in the required pressure. Moreover, conventional techniques cannot produce bulk-sized large transparent gallium nitride single crystal that has a low dislocation density and is of high quality. Besides, the conventional techniques can achieve only a poor yield. More specifically, according to the conventional techniques, the growth rate of the single crystal is extremely slow, for example, about a few micrometers per hour. Thus, even when gallium nitride is grown for 1000 hours, the size of the obtained single crystal is only about a few millimeters. In fact, the largest gallium nitride single crystal that has ever been reported had a maximum diameter of only about 1 cm. Thus, it has been difficult to put gallium nitride to practical use. A method for growing gallium nitride single crystal by reacting lithium nitride ($Li_3N$) with gallium also has been reported (Journal of Crystal Growth 247 (2003) 275-278), for example. However, according to this method, the size of the obtained crystal is only about 1 to 4 mm. The above-described problems are not specific to gallium nitride, but may occur in other Group-III-element nitride semiconductors.

DISCLOSURE OF INVENTION

Therefore, with the foregoing in mind, it is an object of the present invention to provide a method for producing bulk-sized large transparent Group-III-element nitride single crystal that has a low dislocation density and is of high quality with a high yield.

In order to achieve the above object, a first method for producing Group-III-element nitride single crystal according to the present invention includes: reacting at least one Group III element selected from the group consisting of gallium (Ga), aluminum (Al), and indium (In) with nitrogen (N) in a mixed flux containing sodium (Na) and at least one of an alkali metal (other than Na) and an alkaline-earth metal, thereby causing Group-III-element nitride single crystal to grow.

By reacting the Group III element such as gallium with nitrogen in the mixed flux containing sodium and at least one of an alkali metal (other than Na) and an alkaline-earth metal as described above, it is possible to produce bulk-sized large transparent single crystal that has a low dislocation density and is of high quality. Moreover, the pressure to be applied during the reaction may be lower than that in the conventional techniques. The above-noted U.S. patent Publication describes the use of a flux containing sodium alone and the use of an alkaline-earth metal as a catalyst. However, it is to be noted here that the above-described first production method uses the mixed flux containing sodium (Na) and at least one of an alkali metal (other than Na) and an alkaline-earth metal, and the alkaline-earth metal is not used as a catalyst. This is a significant difference between the first production method and the above U.S. patent Publication. Owing to this difference, the first production method can produce bulk-sized large transparent Group-III-element nitride single crystal that is of high quality.

A second production method according to the present invention includes: reacting at least one Group III element selected from the group consisting of gallium (Ga), aluminum (Al), and indium (In) with nitrogen (N) in a metal flux containing at least one of an alkali metal and an alkaline-earth metal, thereby causing Group-III-element nitride single crystal to grow. In the second production method, a Group-III-element nitride is provided beforehand, and the Group-III-element nitride is brought into contact with the metal flux to cause new Group-III-element nitride single crystal to grow using the Group-III-element nitride as a nucleus.

The second production method also can produce bulk-sized large transparent Group-III-element nitride single crystal that is of high quality. Moreover, according to this method, the conditions required for the reaction can be made less stringent than in conventional techniques. Note here that the most important feature of the second production method is that it can produce large single crystal quickly. That is, in the second production method, as the size of the Group-III-element nitride serving as a nucleus increases, larger Group-III-element nitride single crystal can be obtained more quickly. For example, when gallium nitride that is in the form of a thin film is used as a nucleus, gallium nitride single crystal having the same area as the thin film grows in the thickness direction. Thus, for example, in the case where the thin film having a maximum diameter of 5 cm is used, when gallium nitride single crystal having the same area as the thin film grows in the thickness direction by several micrometers to several millimeters, sufficiently large bulk-sized gallium nitride can be obtained. The same applies to other Group-III-element nitrides.

BRIEF DESCRIPTION OF DRAWINGS

FIG. 3A is the SEM photograph at 500× magnification, and FIG. 3B is the SEM photograph at 6000× magnification.

FIG. 9A is the SEM photograph at 1000× magnification, and FIG. 9B is the SEM photograph at 130× magnification.

BEST MODE FOR CARRYING OUT THE INVENTION

Figure 1A:
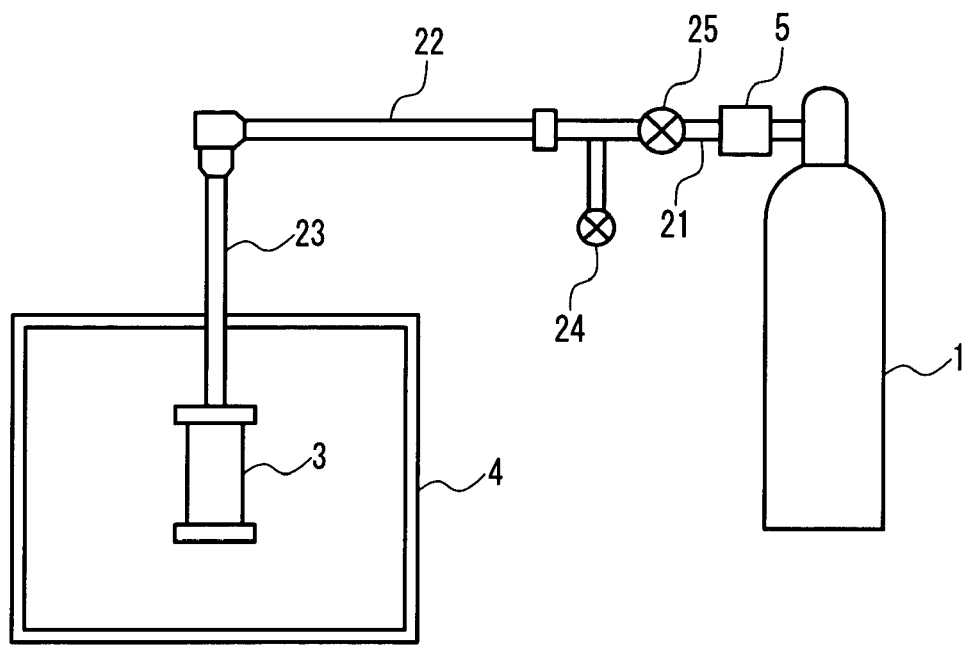
FIGS. 1A and 1B are schematic views showing the configuration of an example of an apparatus to be used for producing gallium nitride single crystal.

Hereinafter, the present invention will be described more specifically by way of examples.

In the present invention, the Group III element may be gallium (Ga), aluminum (Al), and indium (In). Among them, gallium is preferred. Furthermore, the Group-III-element nitride single crystal preferably is gallium nitride (GaN) single crystal. The conditions described in the following are favorable especially for producing gallium nitride single crystal. However, they are applicable to the production of single crystal of other Group-III-element nitrides as well.

In the first production method of the present invention, examples of the alkali metal include lithium (Li), potassium (K), rubidium (Rb), cesium (Cs), and francium (Fr), and examples of the alkaline-earth metal include calcium (Ca), strontium (Sr), barium (Ba), and radium (Ra). They may be used individually or two or more of them may be used together. Among them, Li, Ca, K, Rb, and Cs are preferable, and Li and Ca are more preferable. The alkali metal (other than Na) and/or the alkaline-earth metal may be added so that the ratio (mol %) thereof to the total of the sodium (Na) and the alkali metal (other than Na) and/or the alkaline-earth metal is, for instance, in the range from 0.1 to 99 mol %, preferably from 0.1 to 50 mol %, more preferably from 0.1 to 35 mol %, and still more preferably from 0.1 to 30 mol %. Furthermore, in the case where calcium (Ca) alone is used, the ratio (mol %) of the calcium (Ca) to the total of the sodium (Na) and the calcium (Ca) is, for instance, in the range from 0.1 to 99 mol %, preferably from 0.1 to 50 mol %, more preferably from 0.1 to 35 mol %, and still more preferably from 0.1 to 30 mol %. Also, the ratio (mol %) of the sodium (Na) to the total of the gallium (Ga) and the sodium (Na) is, for instance, in the range from 0.1 to 99.9 mol %, preferably from 30 to 99 mol %, and more preferably from 60 to 95 mol %. The mole ratio of the gallium, sodium, and calcium particularly preferably is Ga:Na:Ca=3.7:9.75:0.25 or 27:51:22. However, note here that the present invention is not limited to the above-mentioned ranges.

In the first production method of the present invention, the melting can be carried out, for example, under conditions of a temperature of 100° C. to 1500° C. and a pressure of 100 Pa to 200 MPa; preferably a temperature of 300° C. to 1200° C. and a pressure of 0.01 MPa to 50 MPa; and more preferably a temperature of 500° C. to 1100° C. and a pressure of 0.1 MPa to 6 MPa.

In the first production method of the present invention, the nitrogen (N) containing gas may be, for example, nitrogen ($N_2$) gas, ammonia ($NH_3$) gas, or the like. Alternatively, the nitrogen (N) containing gas may be a mixed gas obtained by mixing these gases, and the mixing ratio thereof is not particularly limited. Above all, ammonia gas is preferable because the pressure required during the reaction can be reduced.

The first production method of the present invention may be used in combination with the second production method. More specifically, a Group-III-element nitride such as gallium nitride may be provided beforehand, and then the Group-III-element nitride may be brought into contact with the mixed flux to cause new Group-III-element nitride single crystal to grow using the Group-III-element nitride as a nucleus. The conditions and the like required in this case are the same as those in the second production method to be described later.

In the first production method, the mixed flux may contain an impurity as a dopant. By so doing, it is possible to produce gallium nitride single crystal containing an impurity. Examples of the impurity include carbon (C), oxygen (O), silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), and germanium (Ge).

Figure 1B:
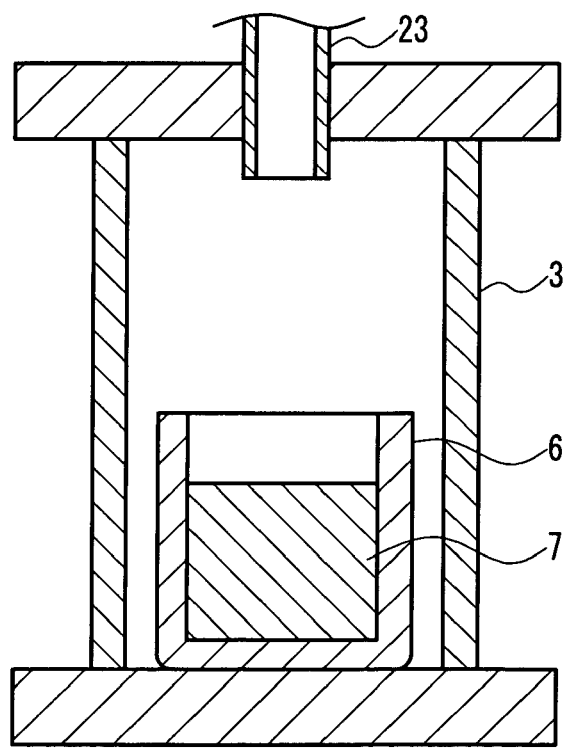

The first production method according to the present invention can be carried out, for example, by using an apparatus shown in FIG. 1. As shown in FIG. 1A, the apparatus includes a gas cylinder 1, an electric furnace 4, and a pressure- and heat-resistant container 3 disposed in the electric furnace 4. To the gas cylinder 1, a pipe 21 is connected. The pipe 21 is provided with a gas pressure regulator 5 and a pressure regulating valve 25, and a leak pipe having a leak valve 24 on its end is connected to a certain position of the pipe 21 excluding both ends thereof. The pipe 21 is connected to a pipe 22, and the pipe 22 is connected to a pipe 23. The pipe 23 extends into an inner space of the electric furnace 4 and is connected to the pressure- and heat-resistant container 3. Furthermore, as shown in FIG. 1B, a crucible 6 is disposed in the pressure- and heat-resistant container 3. The crucible 6 contains gallium, sodium, and either one of or both an alkali metal (other than Na) and an alkaline-earth metal. As the crucible, a BN crucible can be used, for example.

The method for producing Group-III-element nitride single crystal using this apparatus is carried out in the following manner, for example. First, materials such as a Group III element (e.g., gallium), sodium, and calcium are put in the crucible 6, and then the crucible 6 is disposed in the pressure- and heat-resistant container 3. Thereafter, the pressure- and heat-resistant container 3 is disposed in the electric furnace 4 with the end of the pipe 23 being connected to the pressure- and heat-resistant container 3. In this state, nitrogen-containing gas is supplied from the gas cylinder 1 to the pressure- and heat-resistant container 3 through the pipes (21, 22, 23) and the pressure- and heat-resistant container 3 is heated by the electric furnace 4. The pressure inside the pressure- and heat-resistant container 3 is regulated by the pressure regulator 5. The materials in the crucible 6 are melted by being pressurized and heated for a certain period so as to grow single crystal of a Group-III-element nitride such as gallium nitride. Thereafter, the thus-obtained single crystal is taken out of the crucible.

Next, as described above, the second production method according to the present invention is a method for producing Group-III-element nitride single crystal, including: reacting at least one Group III element selected from the group consisting of gallium (Ga), aluminum (Al), and indium (In) with nitrogen (N) in a metal flux containing at least one of an alkali metal and an alkaline-earth metal, thereby causing Group-III-element nitride single crystal to grow, wherein a Group-III-element nitride is provided beforehand, and the Group-III-element nitride is brought into contact with the metal flux to cause new Group-III-element nitride single crystal to grow using the Group-III-element nitride as a nucleus.

The Group-III-element nitride that serves as a nucleus may be single crystal, polycrystal, or amorphous, but preferably is either single crystal or amorphous. The nucleus may be in any form, but preferably is in the form of a substrate or a thin film. When the nucleus is in the form of a thin film, the thin film may be formed on a substrate. Examples of a material for the substrate include amorphous gallium nitride (GaN), amorphous aluminum nitride (AlN), sapphire, silicon (Si), gallium arsenide (GaAs), gallium nitride (GaN), aluminum nitride (AlN), silicon carbide (SiC), boron nitride (BN), lithium gallium oxide ($LiGaO_2$), zirconium boride ($ZrB_2$), zinc oxide (ZnO), various types of glass, various types of metal, boron phosphide (BP), $MoS_2$, $LaAlO_3$, NbN, $MnFe_2O_4$, $ZnFe_2O_4$, ZrN, TiN, gallium phosphide (GaP), $MgAl_2O_4$, $NdGaO_3$, $LiAlO_2$, $ScAlMgO_4$, and $Ca_8La_2(PO_4)_6O_2$. The thickness of the nucleus that is in the form of a thin film is not particularly limited, and may be, for instance, in the range from 0.0005 to 100000 µm, preferably from 0.001 to 50000 µm, and more preferably from 0.01 to 5000 µm. The nucleus in the form of a thin film can be formed on a substrate by, for example, metal organic chemical vapor deposition (MOCVD), hydride vapor phase epitaxy (HVPE), or molecular beam epitaxy (MBE). Note here that a substrate on which a gallium nitride thin film is formed is commercially available and may be used in the present invention. Furthermore, as described above, a substrate itself may be used as a nucleus. The maximum diameter of the thin film or the substrate may be, for example, at least 2 cm, preferably at least 3 cm, more preferably at least 4 cm, and still more preferably at least 5 cm. Note here that a larger maximum diameter is preferred, and there is no upper limit of the maximum diameter. In view of the fact that the standard for a bulk compound semiconductor is 2 inches, the maximum diameter preferably is 5 cm. In this case, the maximum diameter may be in the range from, for example, 2 to 5 cm, preferably 3 to 5 cm, more preferably 4 to 5 cm, and most suitably 5 cm. The maximum diameter as used herein is the longest line that joins two points on the perimeter of the thin film surface or the substrate surface.

In this production method, there is a possibility that the Group-III-element nitride (nucleaus) such as gallium nitride that has been provided beforehand may be dissolved in the flux before the concentration of the nitrogen increases. In order to prevent this, it is preferable that a nitride is present in the flux at least at an initial stage of the reaction. Examples of the nitride include $Ca_3N_2$, $Li_3N$, $NaN_3$, BN, $Si_3N_4$, and InN. They may be used individually or two or more of them may be used together. Furthermore, the ratio of the nitride in the flux may be, for example, 0.0001 mol % to 99 mol %, preferably 0.001 mol % to 50 mol %, and more preferably 0.005 mol % to 5 mol %. Also in the first production method, it is preferable that a nitride is present in the flux in order to prevent the dissolution of the Group-III-element nitride such as gallium nitride serving as a nucleus, and conditions such as a type and a ratio of the nitride are the same as those in the second production method.

In the second production method, the flux may contain an impurity as in the case of the first production method, and the type or the like of the impurity may be the same as that described above.

In the second production method of the present invention, examples of the alkali metal include lithium (Li), sodium (Na), potassium (K), rubidium (Rb), cesium (Cs) and francium (Fr), and examples of the alkaline-earth metal include calcium (Ca), strontium (Sr), barium (Ba), and radium (Ra). They may be used individually (a single-substance flux) or two or more of them may be used together (a mixed flux). As in the case of the first production method, a mixed flux containing sodium and one or more other metals may also be used in the second production method. The type, conditions, etc. of the mixed flux are the same as those described above.

The second production method can be carried out in the same manner as that for carrying out the first production method, except that a Group-III-element nitride is provided beforehand and the Group-III-element nitride is brought into contact with the flux. For example, in the apparatus shown in FIG. 1, a substrate on which a thin film of a Group-III-element nitride such as gallium nitride is formed may be placed in the crucible, so that the Group-III-element nitride reacts with nitrogen in the flux.

Group-III-element nitride transparent single crystal of the present invention can be obtained in the manners described above. However, a method other than those described above also may be used to produce the single crystal of the present invention. The Group-III-element nitride transparent single crystal according to the present invention is bulk-sized transparent Group-III-element nitride single crystal having a dislocation density of $10^5/cm^2$ or less and a maximum diameter of at least 2 cm. The dislocation density of the single crystal according to the present invention preferably is $10^4/cm^2$ or less, more preferably $10^3/cm^2$ or less, and still more preferably $10^2/cm^2$ or less. Most suitably, the single crystal according to the present invention has a negligible dislocation density (e.g., $10^1/cm^2$ or less). Furthermore, the maximum diameter of the single crystal according to the present invention may be, for example, at least 2 cm, preferably at least 3 cm, more preferably at least 4 cm, and still more preferably at least 5 cm. Note here that a larger maximum diameter is preferred, and there is no upper limit of the maximum diameter. In view of the fact that the standard for a bulk compound semiconductor is 2 inches, the maximum diameter preferably is 5 cm. In this case, the maximum diameter may be in the range from, for example, 2 to 5 cm, preferably 3 to 5 cm, more preferably 4 to 5 cm, and most suitably 5 cm. The maximum diameter as used herein is the longest line that joins two points on the perimeter of the single crystal. As described in the following examples, GaN single crystal as one of the Group-III-element nitride single crystals of the present invention does not contain Na as an impurity, and an electrical resistance thereof can be made high (i.e., the GaN single crystal can exhibit a semi-insulating property or an insulating property). Furthermore, the GaN single crystal can exhibit excellent electroconductivity when doped with impurities. Moreover, the GaN single crystal of the present invention can exhibit high photoluminescence (PL) intensity. Besides, the GaN single crystal is advantageous in that it allows a GaN single crystal thin film formed thereon by MOVPE or the like to be of high quality.

Next, a semiconductor device that uses Group-III-element nitride transparent single crystal of the present invention will be described by way of examples. Although the following examples are directed to a field-effect transistor, a light emitting diode (LED), a semiconductor laser diode (LD), and an optical sensor, the semiconductor device of the present invention is not limited thereto. Further examples of the semiconductor device that uses the single crystal of the present invention include the following: a semiconductor device having a simple structure with p-type and n-type semiconductors merely being joined to each other, which uses the single crystal of the present invention as at least one of the semiconductors (e.g., a pnp-type transistor, an npn-type transistor, or an npnp-type thyristor); and a semiconductor device that uses the single crystal of the present invention as a conductive layer, substrate, or semiconductor or as an insulating layer, substrate, or semiconductor. The semiconductor device of the present invention can be produced by using the production method of the present invention in combination with a conventional method. For example, a GaN substrate may be produced by the production method of the present invention, and a semiconductor layer may be formed on the thus-obtained substrate by MOCVD or the like. A GaN thin film or the like that is grown by MOCVD or the like on a GaN substrate produced by the production method of the present invention are of high quality and thus can exhibit excellent properties. Moreover, the production method of the present invention also can be used to form a semiconductor layer. Specifically, first, predetermined materials are put in a crucible to form an n-type GaN layer in a nitrogen containing gas atmosphere by the production method of the present invention. Then, a p-type GaN layer is formed on the n-type GaN layer in the same manner as in the above except that the materials are changed. In this manner, it is possible to produce a pn junction semiconductor device. This method also can be applied to the production of a field-effect transistor, an LED, an LD, a semiconductor optical sensor, and other semiconductor devices, which will be described later. However, it is to be noted here that the method for producing the semiconductor device of the present invention is not limited to the methods described above, and can be produced by any other methods.

Figure 11:
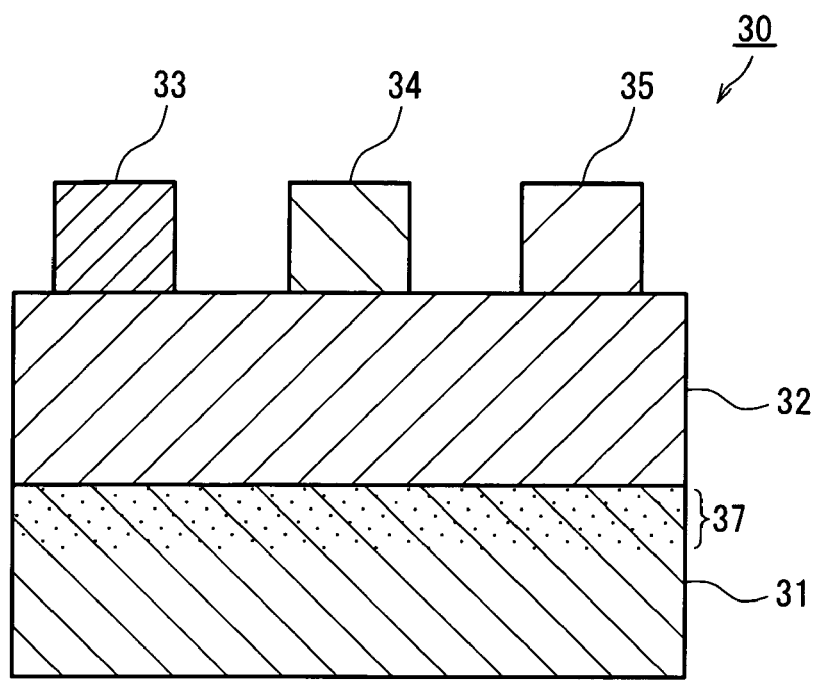
FIG. 11 is a cross-sectional view showing an example of a field-effect transistor according to the present invention.

FIG. 11 shows an example of a field-effect transistor that uses Group-III-element nitride transparent single crystal according to the present invention. As shown in FIG. 11, in this field-effect transistor 30, a conductive semiconductor layer 32 is formed on an insulating semiconductor layer 31, and a source electrode 33, a gate electrode 34, and a drain electrode 35 are formed on the conductive semiconductor layer 32. In FIG. 11, reference numeral 37 denotes high-concentration two-dimensional electrons. In this field-effect transistor, at least one of a substrate for growing the insulating semiconductor layer 31, the insulating semiconductor layer 31, and the conductive semiconductor layer 32 is formed of Group-III-element nitride transparent single crystal of the present invention. The transparent single crystal of the present invention has fewer defects and is excellent in a semi-insulating property or an insulating property as long as it is not doped with impurities. Thus, the insulating semiconductor layer 31 may be formed of the single crystal according to the present invention. For example, although GaN single crystal theoretically has an excellent high frequency property, it has been difficult to realize a field-effect transistor with an excellent high frequency property using conventional GaN single crystal due to the defects of the GaN single crystal. In contrast, the GaN single crystal according to the present invention has substantially no dislocations and is of high quality. Hence, by using the GaN single crystal of the present, it is possible to obtain a field-effect transistor having an excellent high frequency property as expected.

A field-effect transistor of the present invention may include a substrate, on which the field-effect transistor element as described above may be provided. In this case, the substrate may be formed of Group-III-element nitride transparent single crystal according to the present invention. Alternatively, the substrate may be a SiC substrate, an AlN substrate, or a substrate formed of other materials such as sapphire.

Figure 12:
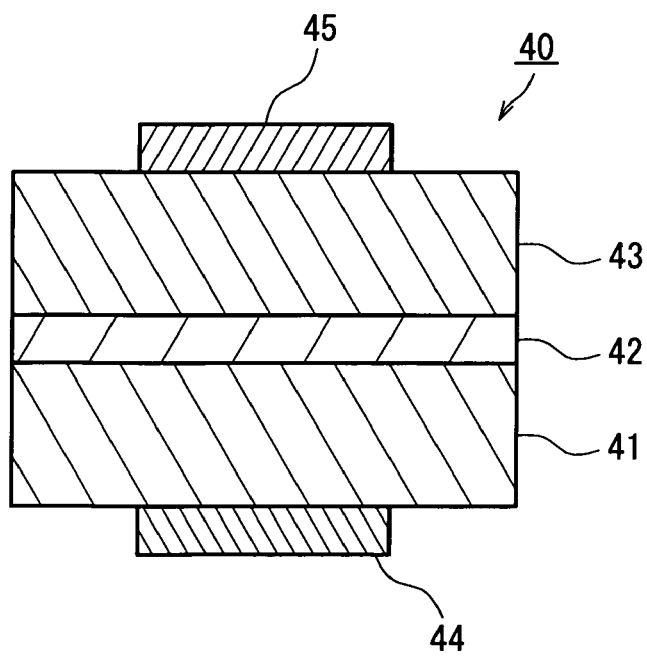
FIG. 12 is a cross-sectional view showing an example of an LED according to the present invention.

Next, a light emitting diode (LED) that uses the single crystal of the present invention includes an n-type semiconductor layer, an active region layer, and a p-type semiconductor layer that are laminated in this order, and at least one of these three layers is formed of Group-III-element nitride transparent single crystal of the present invention. The n-type or p-type semiconductor can be obtained by producing single crystal doped with an appropriate impurity according to the production method of the present invention. FIG. 12 shows an example of an LED according to the present invention. As shown in FIG. 12, in an LED 40, an InGaN layer 42 as an active layer is formed between an n-type GaN layer 41 and a p-type GaN layer 43. Furthermore, an n electrode 44 is disposed on the n-type GaN layer 41 while a p electrode 45 is disposed on the p-type GaN layer 43, which allows the LED to be compact. In contrast, conventional LEDs cannot achieve a compact structure because a substrate is formed of an insulating material, which requires an n-type semiconductor layer to be formed in an L-shape so that an n electrode is formed on a portion of the n-type semiconductor layer that sticks out the side.

An LED of the present invention may include a substrate, on which the light emitting diode element as described above may be provided. In this case, the substrate may be formed of the Group-III-element nitride transparent single crystal of the present invention. Alternatively, the substrate may be a SiC substrate, an AlN substrate, or a substrate formed of other materials such as sapphire. However, when the substrate is formed of the single crystal according to the present invention, the substrate can be conductive, which allows an electrode to be disposed under the substrate.

In the LED of the present invention, the p-type semiconductor layer, the active region layer, and the n-type semiconductor layer may have either a single layer structure or a layered structure. For example, in the semiconductor device shown in FIG. 12, a laminate of a p-type AlGaN layer and a p-type GaN layer may be provided instead of the p-type GaN layer 43.

Figure 13:
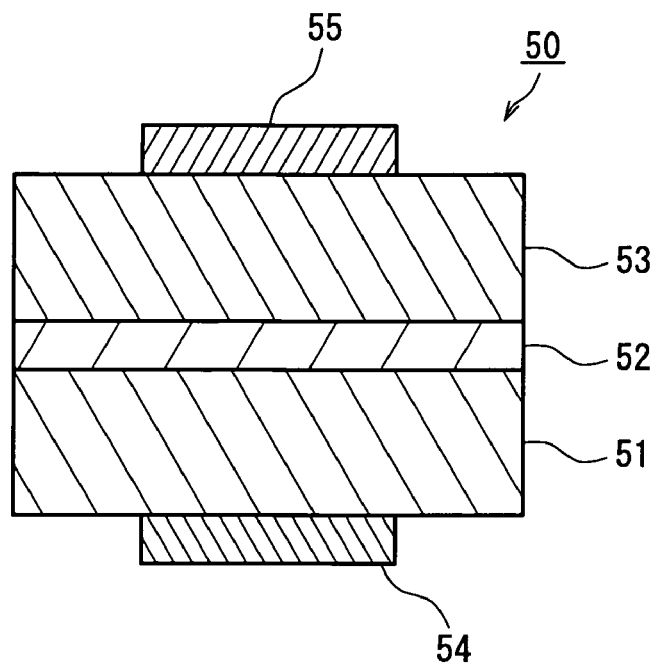
FIG. 13 is a cross-sectional view showing an example of an LD according to the present invention.

Next, a semiconductor laser diode (LD) that uses the single crystal of the present invention includes an n-type semiconductor layer, an active region layer, and a p-type semiconductor layer that are laminated in this order, and at least one of these three layers is formed of Group-III-element nitride transparent single crystal of the present invention. Such an example is shown in FIG. 13. As shown in the drawing, in an LD 50, an InGaN layer 52 as an active layer is formed between an n-type GaN layer 51 and a p-type GaN layer 53. Furthermore, an n electrode 54 is disposed on the n-type GaN layer 51 while a p electrode 55 is disposed on the p-type GaN layer 53, which allows the LD to be compact. In contrast, conventional LDs cannot achieve a compact structure because a substrate is formed of an insulating material, which requires an n-type semiconductor layer to be formed in an L-shape so that an n electrode is formed on a portion of the n-type semiconductor layer that sticks out the side.

An LD of the present invention may include a substrate, on which the semiconductor laser diode element as described above may be provided. In this case, the substrate may be formed of the Group-III-element nitride transparent single crystal of the present invention. Alternatively, the substrate may be a SiC substrate, an AlN substrate, or a substrate formed of other materials such as sapphire. However, when the substrate is formed of the single crystal according to the present invention, the substrate can be conductive, which allows an electrode to be disposed under the substrate.

In the LD of the present invention, the p-type semiconductor layer, the active region layer, and the n-type semiconductor layer may have either a single layer structure or a layered structure. For example, in the semiconductor device shown in FIG. 13, a laminate in which a p-type AlGaN capping layer, a p-type GaN waveguiding layer, a p-type AlGaN/GaN MD-SLS cladding layer, and a p-type GaN layer are laminated in this order may be provided instead of the p-type GaN layer 53, and a laminate in which an n-type AlGaN/GaN MD-SLS cladding layer and an n-type GaN waveguiding layer are laminated in this order may be formed instead of the n-type GaN layer.

Figure 14:
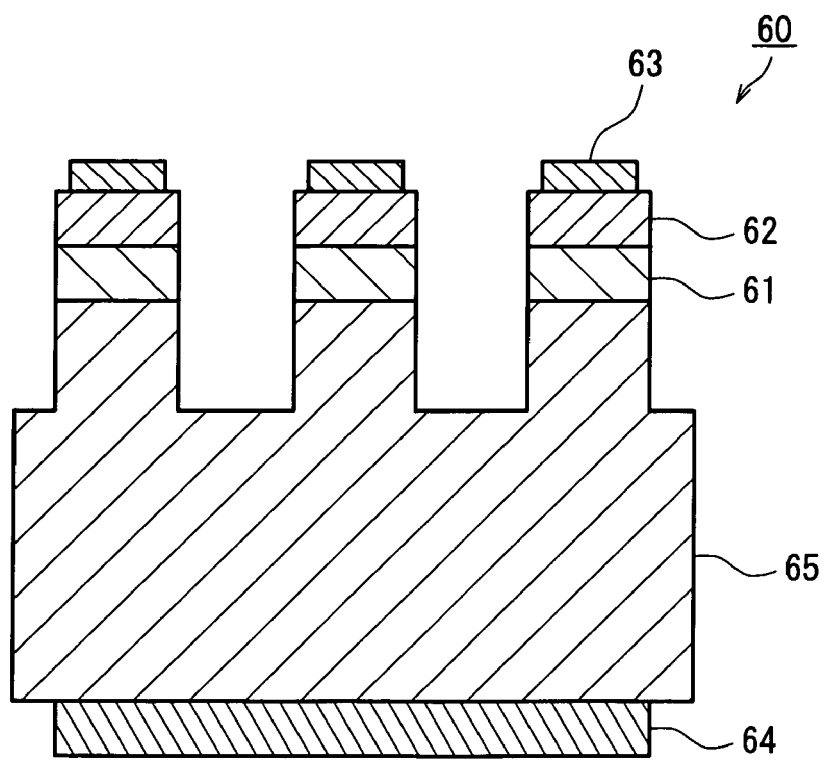
FIG. 14 is a cross-sectional view showing an example of a semiconductor sensor according to the present invention.

Next, a semiconductor optical sensor according to the present invention is an optical sensor element in which a p-type semiconductor layer and an n-type semiconductor layer are joined to each other, and at least one of the semiconductor layers is formed of the Group-III-element nitride transparent single crystal according to the present invention. FIG. 14 shows an example of such a semiconductor optical sensor. As shown in FIG. 14, a semiconductor optical sensor 60 includes a GaN substrate 65 having three projections. An n-type GaN layer 61 and a p-type GaN layer 62 are laminated in this order on each of the projections, and at least one of these layers is formed of single crystal according to the present invention. An n electrode 64 (Au/Ti electrode) is formed on the bottom of the substrate 65, while a p electrode 63 (Au/Ti electrode) is formed on the p-type GaN layer 62 on each of the projections.

A semiconductor optical sensor of the present invention may include a substrate, on which the semiconductor optical sensor as described above may be provided. In this case, the substrate may be formed of the Group-III-element nitride transparent single crystal of the present invention. Alternatively, the substrate may be a SiC substrate, an AlN substrate, or a substrate formed of other materials such as sapphire. However, when the substrate is formed of the single crystal according to the present invention, the substrate can be conductive, which allows an electrode to be disposed under the substrate.

EXAMPLES

Hereinafter, examples of the present invention will be described along with comparative examples.

Example 1

Using the apparatus shown in FIG. 1, single crystal of gallium nitride was produced in the same manner as described above. More specifically, gallium, sodium, and calcium were put in a BN crucible, and then they were melted by being pressurized and heated under the following conditions in a nitrogen ($N_2$) gas atmosphere so as to grow single crystal of gallium nitride. In the present example, the sodium and the calcium were blended so as to have the following six different blend ratios.

(Producing Conditions)
  Growth temperature: 800° C.
  Growth pressure ($N_2$): 30 atm (3.04 MPa)
  Growth period: 96 hours
  Crucible used: BN crucible (Blend Ratio)
  With respect to 1 g of gallium (Ga), sodium (Na) and calcium (Ca) were blended so that they were present at the ratios indicated in the following table.

| Sample No. | Na:Ca (mole ratio) | Na (g) | Ca (g) |
|---|---|---|---|
| 1. | 9.75:0.25 | 0.85956 | 0.038422 |
| 2. | 9:1 | 0.79344 | 0.153688 |
| 3. | 8.5:1.5 | 0.74936 | 0.230531 |
| 4. | 8:2 | 0.70528 | 0.307375 |
| 5. | 7.5:2.5 | 0.6612 | 0.384219 |
| 6. | 7:3 | 0.61712 | 0.461063 |

With regard to each of the thus-obtained six types of single crystals (samples 1 to 6), it was confirmed that the obtained single crystal was of gallium nitride and the amount of gallium nitride generated was measured in the following manner. Also, any blackening of the single crystal was observed visually and with an optical microscope. The results are shown in the following. Furthermore, as a comparative example, gallium nitride single crystal was produced in the same manner as in the example (Ga:Na (weight ratio)=3:7) except that the pressure was set to 5 MPa and no calcium was added.

(Confirmation as to Whether the Crystals Obtained were of Gallium Nitride)

Elementary analysis (EDX: Energy-Dispersive X-ray spectroscopy) and photoluminescence (PL) were performed to confirm the single crystals obtained were of gallium nitride. The elementary analysis was carried out by irradiation with an electron beam with an acceleration voltage 15 kV while confirming the position of the sample with an electron microscope. The photoluminescence measurement was carried out by irradiation with a helium-cadmium laser beam at ordinary temperature.

(Measurement of the Amount of Gallium Nitride Generated)

The volume of each of the obtained single crystals was determined, which was then converted into an amount of the generated gallium nitride.

| Sample No. | Na:Ca (mole ratio) | Amount (g) of gallium nitride generated from 1.00 g of Ga |
|---|---|---|
| 1. | 9.75:0.25 | 0.09102 |
| 2. | 9:1 | 0.16016 |
| 3. | 8.5:1.5 | 0.11704 |
| 4. | 8:2 | 0.13543 |
| 5. | 7.5:2.5 | 0.13827 |
| 6. | 7:3 | 0.01699 |
| Comp. Ex. | (Na only) | 0.01549 |

As described above, in the present example, gallium nitride single crystals were obtained at a low pressure. Besides, the amounts of the gallium nitride generated were equivalent to or greater than that generated in the comparative example in which sodium alone was used.

Figure 2:
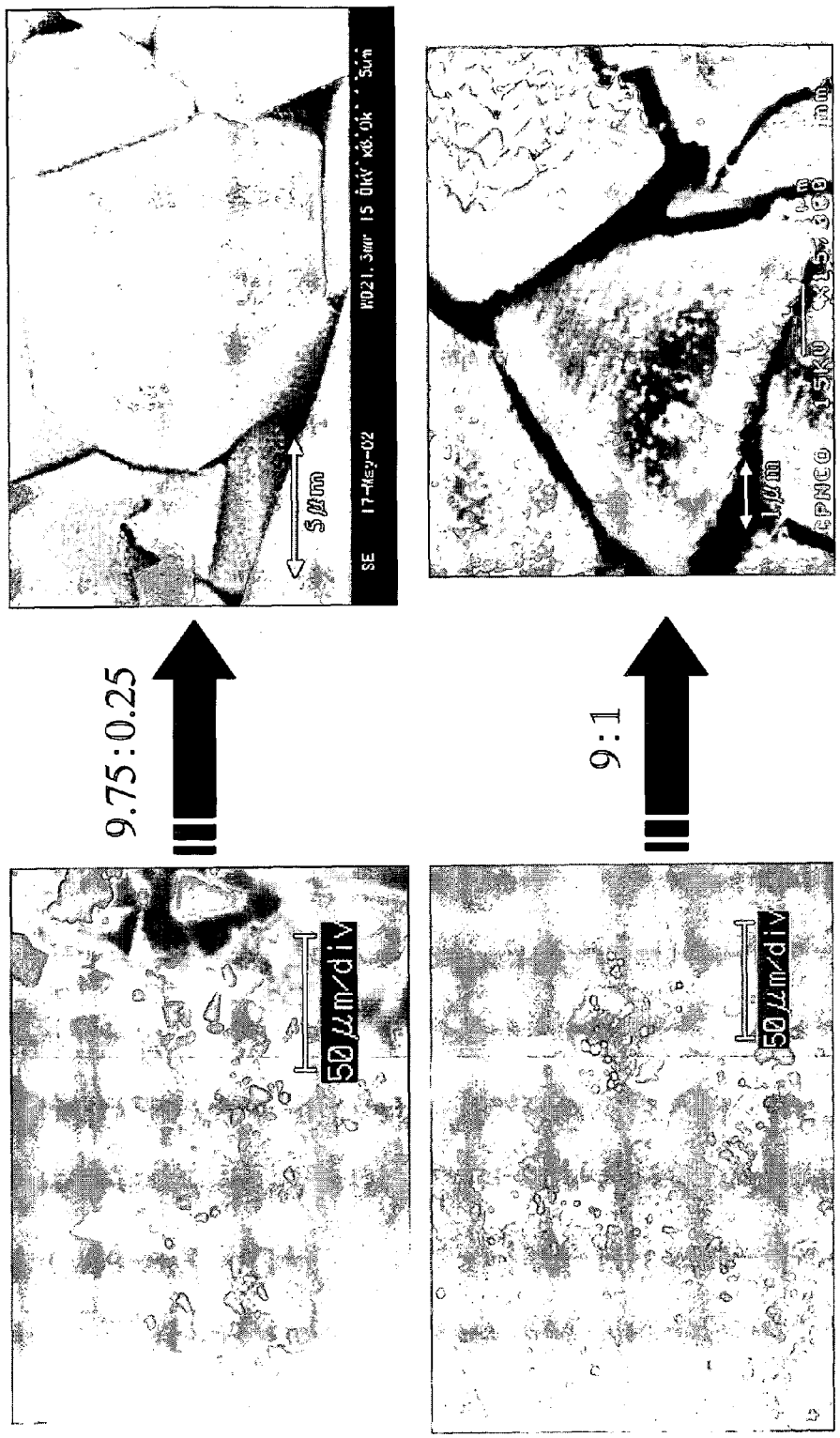
FIG. 2 shows scanning electron microscope (SEM) photographs of gallium nitride single crystal obtained by an example of a production method according to the present invention.

FIG. 2 shows photographs of the gallium nitride single crystals obtained in the example. In FIG. 2, the two photographs located on the upper side are photographs of the single crystal of the sample No. 1, and the two photographs located on the lower side are photographs of the single crystal of the sample No. 2. In FIG. 2, the two photographs on the left side are optical microscope photographs at 245× magnification. On the other hand, the two photographs on the right side are SEM photographs, and one on the upper side is at 6000× magnification while the one on the lower side is at 15000× magnification. As shown in FIG. 2, these single crystals were colorless, transparent and of high quality. Other samples also were colorless, transparent, and of high quality. In contrast, the single crystal according to the comparative example was blackened.

Example 2

Gallium nitride single crystal was produced at a growth pressure ($N_2$) of 15 atm. In the present example, sodium (Na) and calcium (Ca) were blended so that 0.74936 g of sodium (Na) and 0.153688 g of calcium (Ca) (Na:Ca=9:1) were present with respect to 1 g of gallium (Ga). Except for the above, the gallium nitride single crystal was produced in the same manner as in Example 1. As a result, the amount of the gallium nitride obtained was 0.06902 g.

Example 3

A rectangular sapphire substrate (4 mm×15 mm with a thickness of 0.3 mm) on which a thin film (thickness: 3 μm) of gallium nitride single crystal had been formed was provided. The substrate was placed in a BN crucible (inner diameter: 19 mm, depth: 5 mm), and gallium (Ga), sodium (Na), and calcium (Ca) further were put in the BN crucible. The BN crucible was then set in the pressure-and heat-resistant container in the apparatus shown in FIG. 1. Thereafter, nitrogen gas was supplied to the container, and the container was heated so that gallium nitride single crystal was grown on the thin film. The conditions for the crystal growth were as follows. FIG. 3 shows SEM photographs of the thus-obtained single crystal.

(Producing Conditions)
Growth temperature: 800° C.
Growth pressure: 30 atm (3.04 MPa)
Growth period: 24 hours
Na:Ca=9:1 (mole ratio with respect to 1 g of gallium)

Figure 3A:
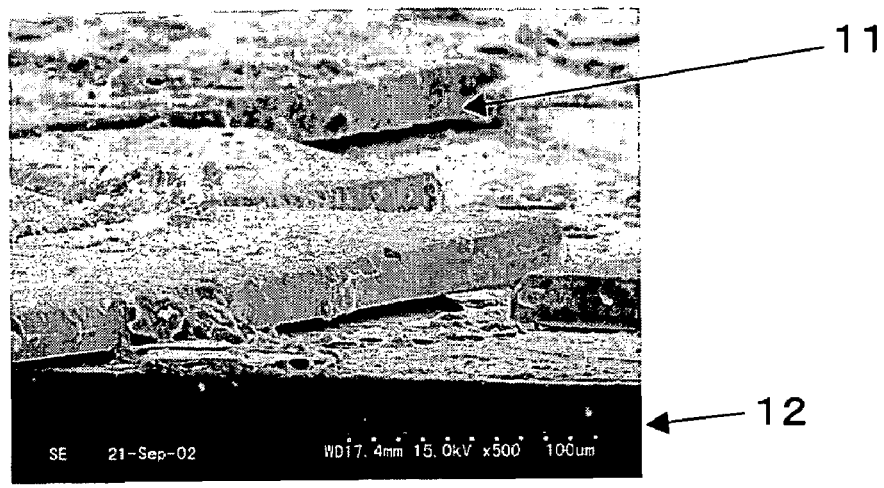
FIGS. 3A and 3B are scanning electron microscope (SEM) photographs of gallium nitride single crystal obtained by another example of a production method according to the present invention.
Figure 3B:
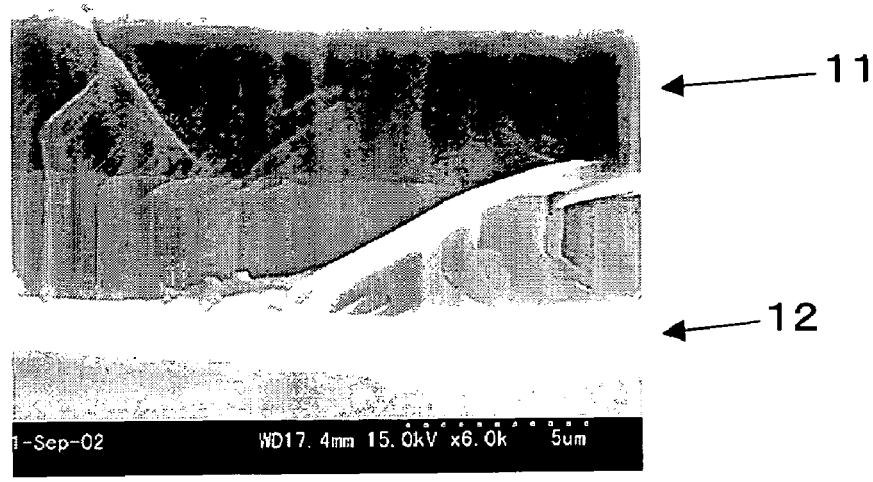

In FIG. 3, FIG. 3A is a SEM photograph at 500× magnification and FIG. 3B is the SEM photograph at 6000× magnification. As shown in FIGS. 3A and 3B, the growth of the gallium nitride single crystal 11 on the sapphire substrate 12 was confirmed.

Example 4

Figure 4:
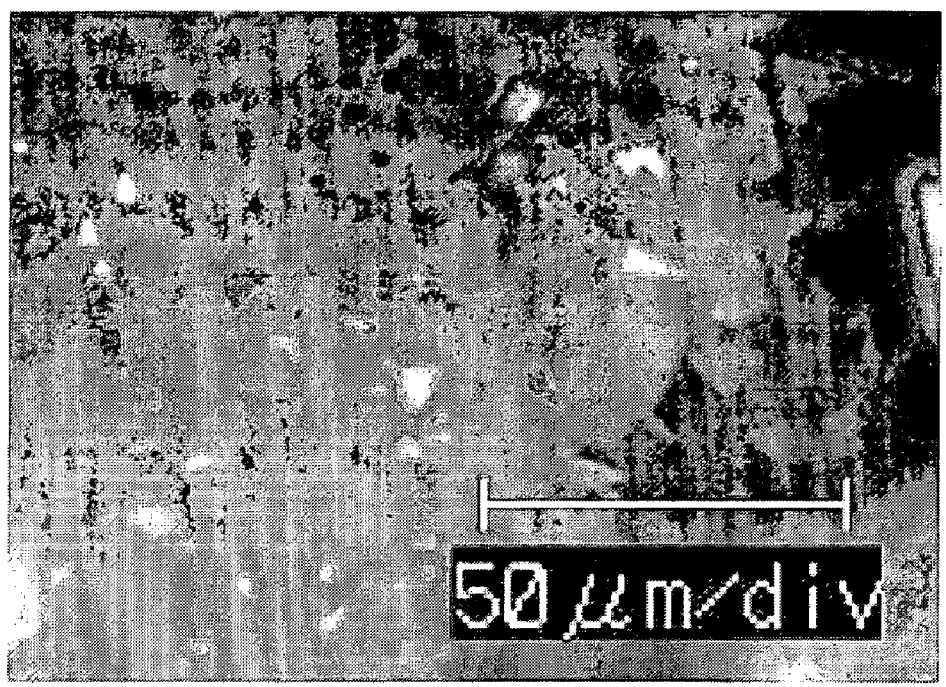
FIG. 4 is an optical microscope photograph (245× magnification) of gallium nitride single crystal obtained by still another example of a production method according to the present invention.

Using the apparatus shown in FIG. 1, gallium nitride single crystals were produced in the following manner. A boron nitride crucible containing a raw material (1.0 g of gallium) and a flux (sodium and calcium) was placed in a pressure-resistant stainless steel container. The stainless steel container containing the crucible was heated to a growth temperature of 800° C., and at the same time, the pressure of nitrogen gas was increased to 30 atm. The temperature and pressure were kept constant for 96 hours. In the present example, the calcium and sodium as components of the flux were present at the ratios indicated in the following table. Furthermore, the composition ratio of the gallium and the flux represented by mole ratio was adjusted so as to be consistently 3.7:10. The yield of each gallium nitride single crystal was shown in the following table. FIG. 4 shows a SEM photograph of the single crystal (Na:Ca=9:1) obtained in the present example.

| Na:Ca | yield (%) of gallium nitride |
|---|---|
| 9.75:0.25 | 7.58% |
| 9.5:0.5 | 13.94% |
| 9:1 | 13.34% |
| 8.5:1.5 | 9.75% |
| 8:2 | 11.28% |
| 7.5:2.5 | 11.51% |
| 7:3 | 1.41% |
| The flux contained Na alone. | 1.29% |

As shown in the above table, gallium nitrides were obtained with high yields. Furthermore, each of the obtained gallium nitride single crystals was transparent as shown in FIG. 4 and had a maximum diameter of at least 2 cm. Moreover, examination by the etching method revealed that the gallium nitride single crystals had substantially no dislocations.

Example 5

Using the apparatus shown in FIG. 1, gallium nitride single crystal was produced in the following manner. A boron nitride crucible containing a raw material (1.0 g of gallium) and a flux (0.50 g of sodium and 0.10 g of calcium) was placed in a pressure-resistant stainless steel container. The stainless steel container containing the crucible was heated to a growth temperature of 800° C., and at the same time, the pressure of nitrogen gas was increased to a predetermined atmospheric pressure. The temperature and pressure were kept constant for 96 hours. In the present example, the mole ratio of gallium and the flux was set to 3.7:10, and the ratio of the sodium and calcium was set to 9:1. As a comparative example, gallium nitride single crystal was produced in the same manner as in the above using a flux containing sodium alone. The results are shown in FIG. 5.

Figure 5:
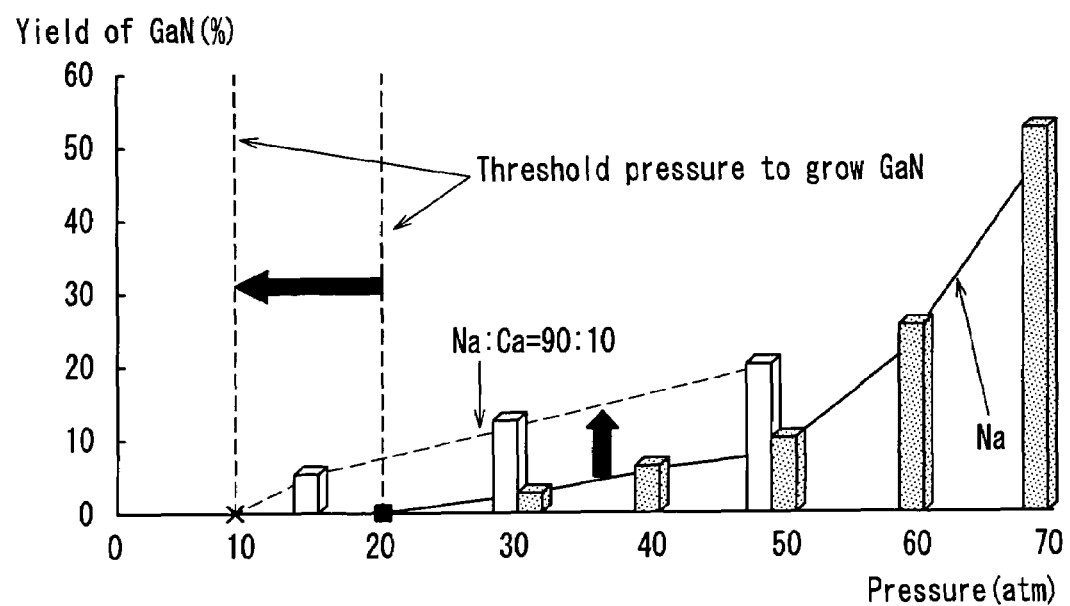
FIG. 5 is a graph showing a relationship between a pressure during the reaction and a yield of gallium nitride single crystal in still another example of a production method according to the present invention.

As can be seen from FIG. 5, although the GaN crystal generation using the flux containing no calcium required a nitrogen pressure of 25 atm or more, the required nitrogen pressure was reduced to 15 atm when the flux containing calcium was used.

Example 6

Figure 6:
FIG. 6 is an optical microscope photograph (245× magnification) of gallium nitride single crystal obtained by still another example of a production method according to the present invention.

Using the apparatus shown in FIG. 1, gallium nitride single crystals were produced in the following manner. A boron nitride crucible containing a raw material (1.0 g of gallium) and a flux (sodium and lithium) was placed in a pressure-resistant stainless steel container. The stainless steel container containing the crucible was heated to a growth temperature of 850° C., and at the same time, the pressure of nitrogen gas was increased to 50 atm. These temperature and pressure were kept constant for 96 hours. In the present example, the ratio of the lithium and sodium as components of the flux was varied in the range from 0:1 to 1:0. Furthermore, the composition ratio of the gallium and the flux represented by the mole ratio was adjusted so as to be consistently 3.7:10. As a result, it was found that the yield of the bulk-sized GaN crystal at a nitrogen gas pressure of 50 atm increased drastically by adding lithium to the flux. Furthermore, the color of each of the bulk-sized GaN crystals obtained was transparent as shown in the optical microscope photograph of FIG. 6, and the maximum diameter thereof was at least 2 cm. Moreover, examination by the etching method revealed that the bulk-sized GaN crystals had substantially no dislocations.

Example 7

Figure 7:
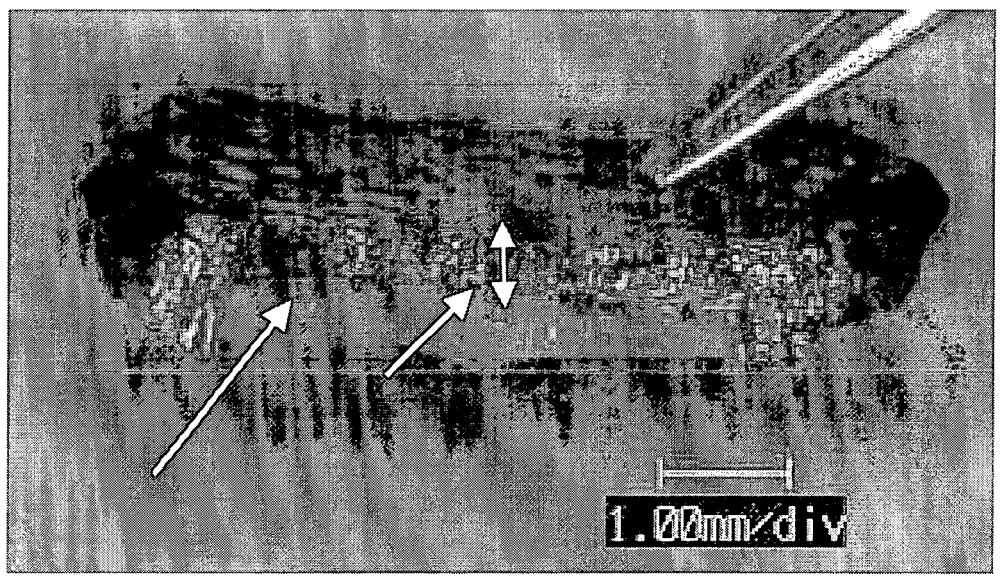
FIG. 7 is a photograph of gallium nitride single crystal obtained by still another example of a production method according to the present invention.
Figure 8:
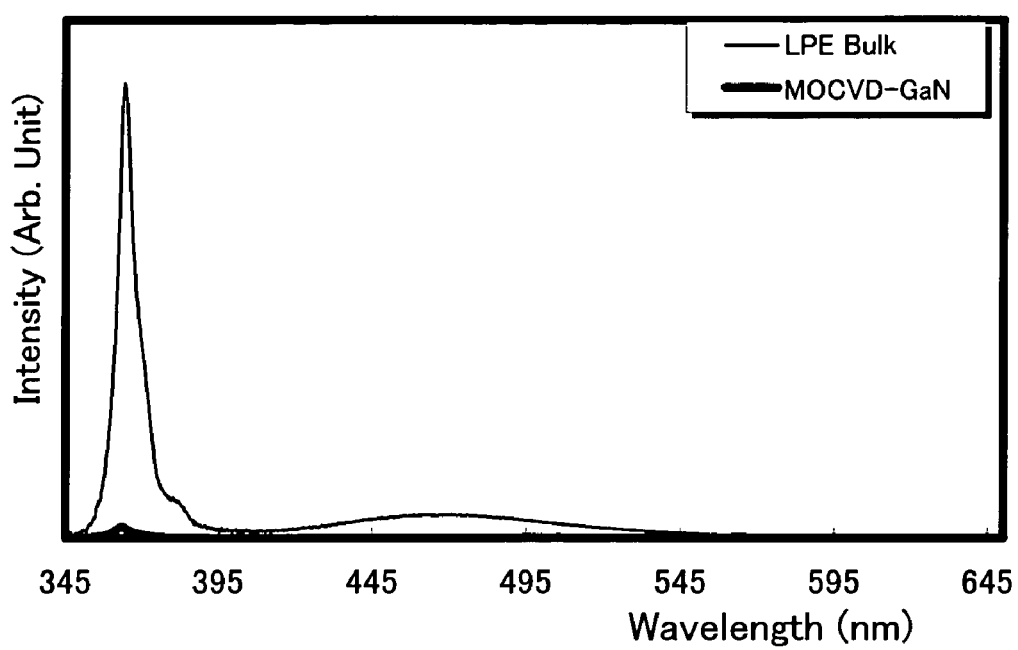
FIG. 8 is a graph showing a photoluminescence intensity in still another example of the present invention.
Figure 9A:
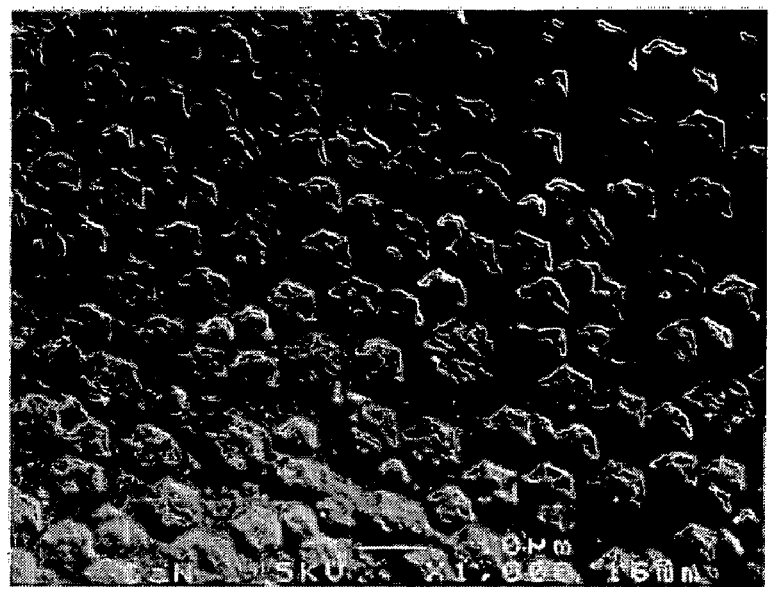
FIGS. 9A and 9B are scanning electron microscope (SEM) photographs of gallium nitride single crystal obtained by still another example of a production method according to the present invention.
Figure 9B:
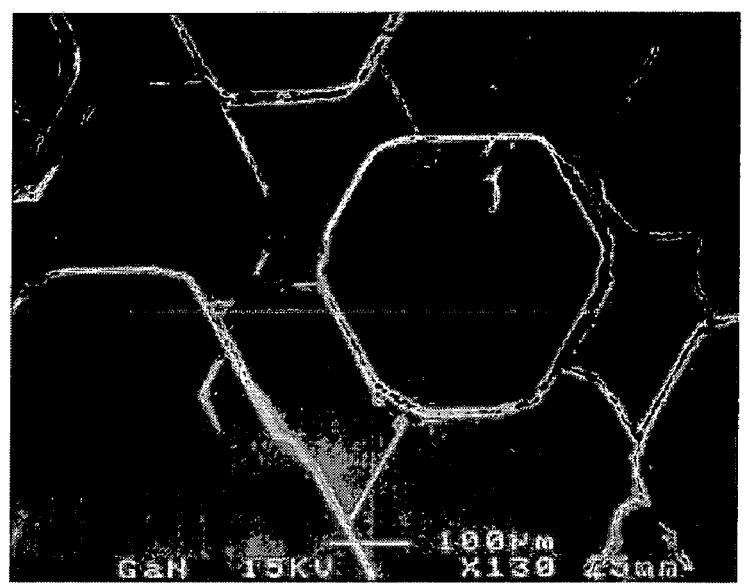

Using the apparatus shown in FIG. 1, gallium nitride single crystal was produced in the following manner. A boron nitride crucible containing a raw material (1.00 g of gallium), a flux (0.881g of sodium), and a sapphire substrate on which a 3 μm thick GaN thin film had been formed by MOCVD was placed in a pressure-resistant stainless steel container. The stainless steel container containing the crucible was heated to a growth temperature of 800° C., and at the same time, the pressure of nitrogen gas was increased to 50 atm. The temperature and pressure were kept constant for 96 hours. As a result, as shown in an optical microscope photograph of the FIG. 7, an 800 μm thick bulk-sized GaN crystal was grown on the GaN thin film formed by MOCVD on the substrate. With regard to the thus-obtained bulk-sized GaN crystal, photoluminescence (PL) measurement was performed. As a result, as shown in the graph of FIG. 8, the bulk-sized GaN crystal exhibited a PL intensity 43 times as high as that of the GaN thin film formed by MOCVD as a base for growing the GaN crystal. Furthermore, as a result of dislocation density measurement by the etching method, although dislocation of about $10^6/cm^2$ was observed in the GaN thin film formed by MOCVD on the substrate, the bulk-sized GaN crystal had substantially no dislocations (see SEM photographs of FIG. 9).

Example 8

Figure 10:
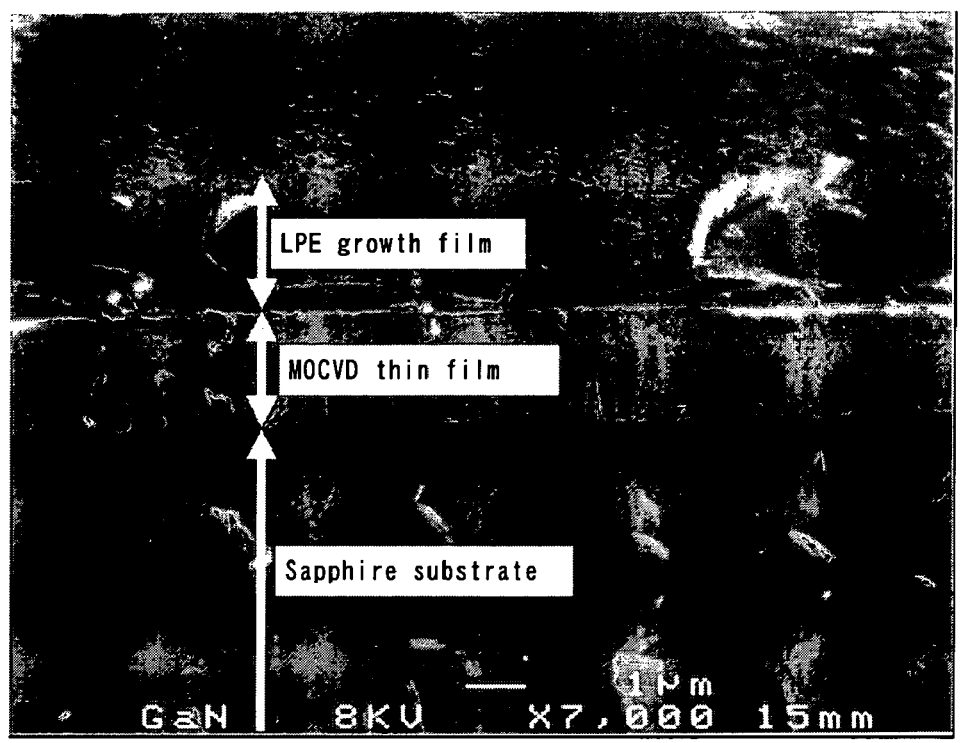
FIG. 10 is a scanning electron microscope (SEM) photograph (7000× magnification) of gallium nitride single crystal obtained by still another example of a production method according to the present invention.

Using the apparatus shown in FIG. 1, gallium nitride single crystal was produced in the following manner. A boron nitride crucible containing a raw material (1.00 g of gallium), a flux (0.50 g of sodium and 0.10 g of calcium), and a sapphire substrate on which a 3 μm thick GaN thin film had been formed by MOCVD was placed in a pressure-resistant stainless steel container. The stainless steel container containing the crucible was heated to a growth temperature of 800° C., and at the same time, the pressure of nitrogen gas was increased to 5 atm. The temperature and pressure were kept constant for 96 hours. As a result, a 2 μm thick bulk-sized GaN crystal that was colorless and transparent was grown on the 3 μm thick GaN thin film formed by MOCVD on the substrate (see a SEM photograph of FIG. 10). The gallium nitride had a maximum diameter of at least 2 cm. Moreover, examination by the etching method revealed that the gallium nitride single crystal had substantially no dislocations.

Example 9

Using the apparatus shown in FIG. 1, gallium nitride single crystals were produced in the following manner. A boron nitride crucible containing a raw material (1.00 g of gallium) and a flux (0.881 g of sodium) was placed in a pressure-resistant stainless steel container. The stainless steel container containing the crucible was heated to a growth temperature of 800° C., and at the same time, the pressure of a raw material gas was increased to a predetermined atmospheric pressure. The temperature and pressure were kept constant for 96 hours. As the raw material gas, nitrogen gas containing ammonia was used. The mixing ratio of ammonia to the nitrogen gas was varied in the range from 0% to 100%. The results are shown in the following table.

| $NH_3$ ratio (%) | gallium nitride single crystal generating pressure (atm) |
| --- | --- |
| 0 | 25 |
| 4 | 20 |
| 10 | 15 |
| 15 | 15 |
| 25 | 10 |
| 40 | 10 |
| 100 | 10 |

As is clear from the results shown in the above table, the use of the ammonia-containing gas allowed the gallium nitride single crystals to be obtained at a lower pressure. Each of the obtained gallium nitride single crystals was transparent and had a maximum diameter of at least 2 cm. Moreover, examination by the etching method revealed that the gallium nitride single crystals had substantially no dislocations.

Example 10

Figure 15:
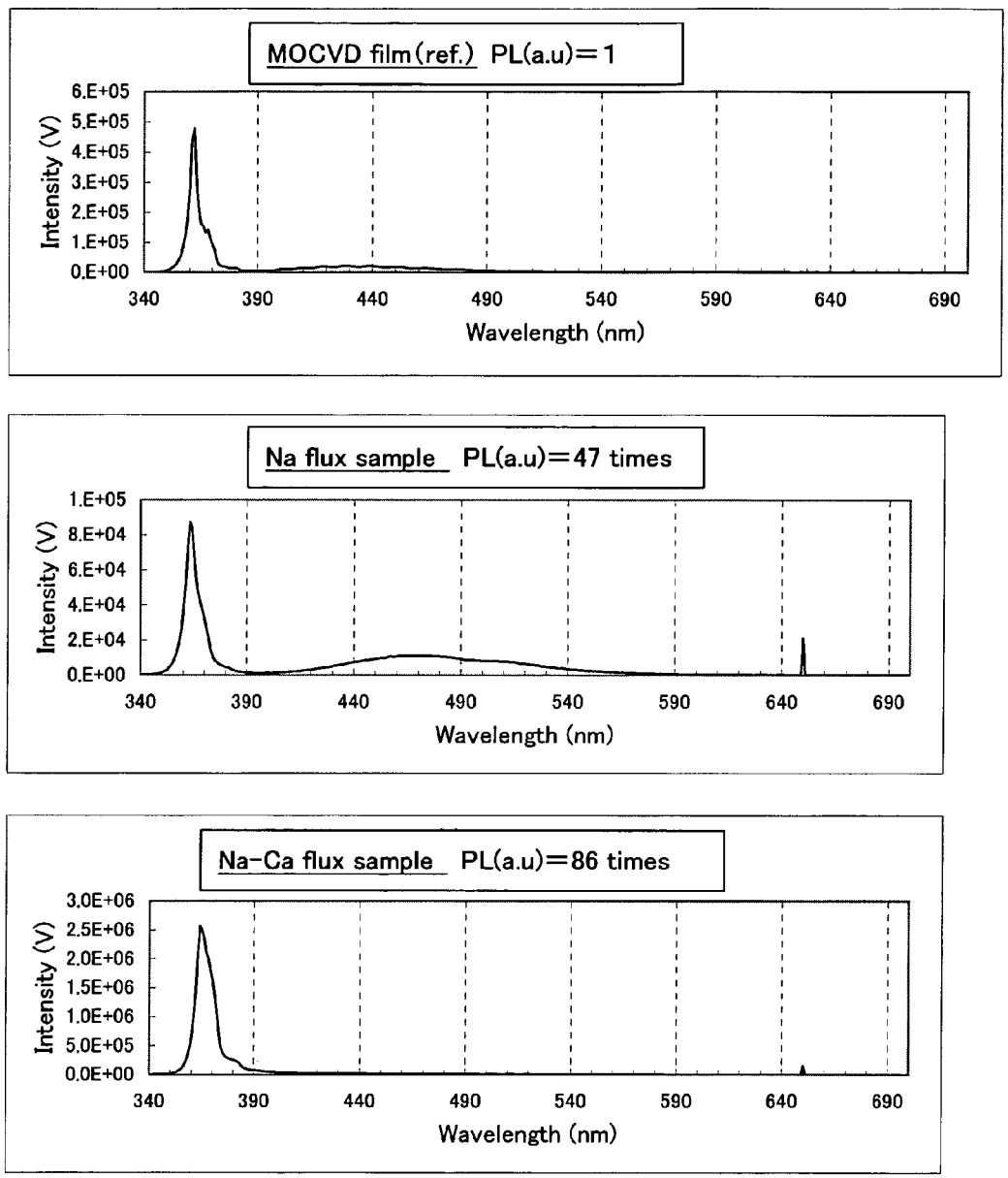
FIG. 15 is graphs showing the results of PL measurement performed with respect to GaN single crystals obtained by still another example of a production method according to the present invention.

1.0 g of Ga, a flux component(s), and a sapphire substrate were put in a BN crucible. The sapphire substrate had a 3 μm thick GaN thin film formed by MOCVD on a surface thereof. The mole ratio of Ga and the flux was set to Ga:flux=2.7:7.3. In the present example, two types of fluxes were used, namely, a flux containing 97% Na and 3% Ca and a flux containing 100% Na. Using the apparatus shown in FIG. 1, nitrogen gas was supplied, and crystal growth for 96 hours was performed at a pressure of 50 atm and at a heating temperature of 800° C. After the crystal growth, residual materials were treated with ethanol and water. Thus, two types of GaN single crystals were obtained. With regard to these single crystals, photoluminescence (PL) measurement was performed. The PL measurement was carried out by irradiating a surface of the single crystal with a He—Cd laser beam (with a wavelength of 325 nm) serving as a pumping beam at an output of 10 mW. The results are shown in FIG. 15. In FIG. 15, the upper graph shows the result of the PL measurement with regard to the GaN thin film formed on the sapphire substrate as a control. The graph located in the middle shows the result of the PL measurement with regard to the GaN single crystal obtained using the flux containing 100% Na. The lower graph shows the result of the PL measurement with regard to the GaN single crystal obtained using the Na—Ca mixed flux. As can be seen from FIG. 15, the PL intensity of the GaN single crystal obtained using the flux containing 100% Na was 47 times as high as that of the control, and the PL intensity of the GaN single crystal obtained using the Na—Ca mixed flux was 86 times as high as that of the control. Moreover, in the GaN single crystal obtained using the Na—Ca mixed flux, the broad peak observed between 400 nm to 570 nm in the GaN single crystal obtained using the flux containing 100% Na was not confirmed. From this fact, it can be said that, although the GaN single crystal obtained using the flux containing Na alone can achieve higher quality than the conventional GaN single crystal, the GaN single crystal obtained using the Na—Ca mixed flux can achieve still higher quality.

Figure 16A:
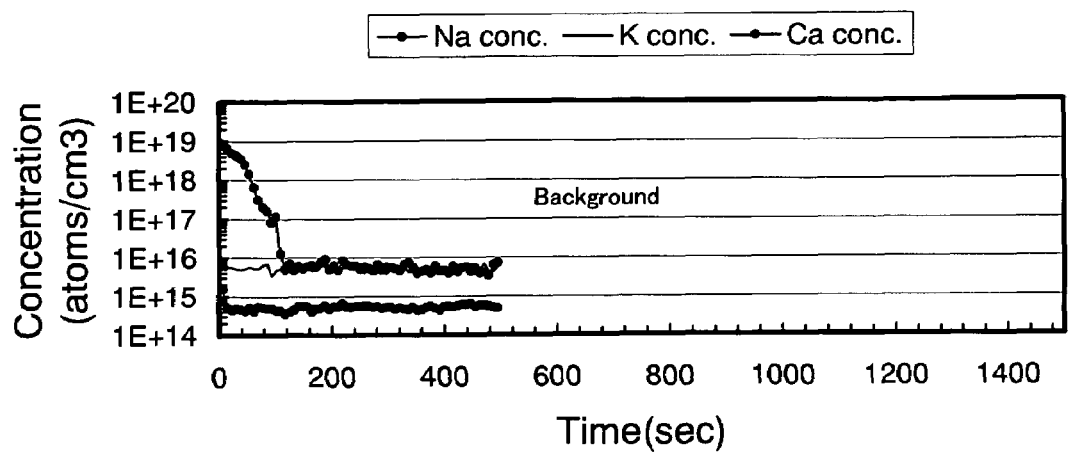
FIG. 16A is a graph showing background of SIMS analysis.
Figure 16B:
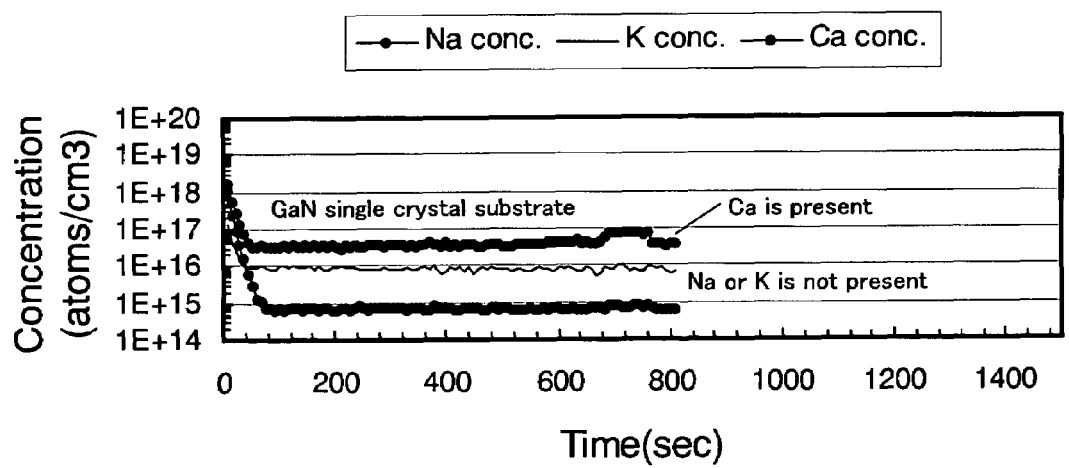
FIG. 16B is a graph showing the result of SIMS analysis performed with respect to the GaN single crystal obtained in the example shown in FIG. 15.

Next, impurities contained in the GaN single crystal obtained using the Na—Ca mixed flux were examined by secondary ion mass spectrometry (SIMS). The result of SIMS was shown in the graphs of FIG. 16. In FIG. 16, the left graph shows the background, and the right graph shows the result of SIMS. As shown in FIG. 16, in this single crystal, Ca was detected, but no Na or K was detected. It is to be noted that, because the amount of the detected Ca was very small and Ca is a P-type dopant, the Ca has no effect on the quality of the GaN single crystal.

Example 11

1.0 g of Ga, a flux component (Na), a dopant (Si), and a sapphire substrate were put in a BN crucible. The sapphire substrate had a 3 μm thick GaN thin film formed by MOCVD on a surface thereof. The mole ratio of Ga and Na was set to Ga:Na=2.7:7.3, and the mole ratio of Ga and Si was set to Ga:Si=100:0.1. Using the apparatus shown in FIG. 1, nitrogen gas was supplied, and crystal growth for 15 hours was performed at a pressure of 50 atm and at a heating temperature of 800° C. After the crystal growth, residual materials were treated with ethanol and water. Thus, GaN single crystal doped with Si was obtained. An electrical resistance of this GaN single crystal was measured with a tester. As a result, the electrical resistance was 150 Ω when the distance between electrodes was 5 mm. Thus, it can be said that GaN single crystal doped with Si has an extremely low resistance. Furthermore, as a control, GaN single crystal was produced in the same manner as in the above except that it was not doped with Si, and an electrical resistance thereof was measured in the same manner as in the above. As a result, the electrical resistance was not less than $10^{10}$ Ω, and it was found that the GaN single crystal was substantially an insulator.

Example 12

Figure 17:
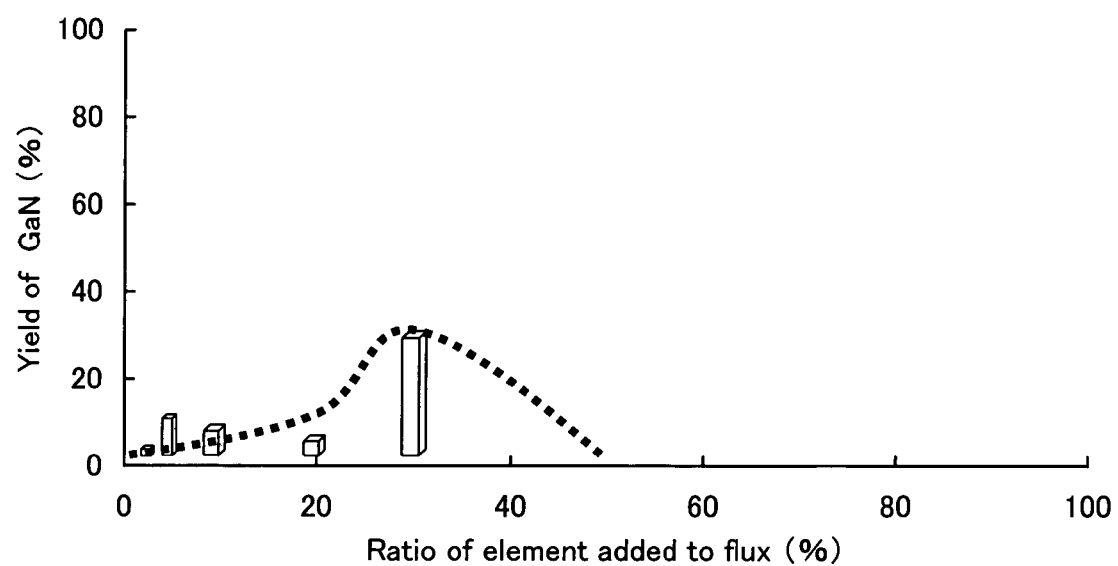
FIG. 17 is a graph showing a relationship between a ratio of Ca in a Na—Ca mixed flux and a yield of GaN single crystal in still another example of a production method according to the present invention.

The weight of Ga was set to 1.0 g consistently. The mole ratio of Ga to a flux was set to Ga:flux=2.7:7.3 consistently. Na and Ca as components of the flux were weighed so that the mole ratio of Ca to Na (Ca/Na) varied gradually from 0 to 1. The weighed materials were put in a BN crucible. Using the apparatus shown in FIG. 1, nitrogen gas was supplied to the BN crucible, and the BN crucible was heated and pressurized to grow GaN single crystal. Conditions for the crystal growth were as follows: the heating temperature was 800° C.; the pressure was 15 atm, and the growth period was 96 hours. After the crystal growth, residual materials were treated with ethanol and water. Thus, GaN single crystals were obtained. The relationship between the ratio of Ca and the yield of GaN single crystal is shown in the graph of FIG. 17. In FIG. 17, the horizontal axis represents the ratio of Ca and the vertical axis represents the yield of the GaN single crystal. As shown in FIG. 17, the yield of the bulk-sized GaN crystal at a nitrogen gas pressure of 15 atm reached to 29% when the ratio of the calcium in the flux was 30% (Na 70%).

Example 13

On the GaN single crystal produced using the flux containing Na alone in Example 10, a GaN single crystal thin film further was formed by MOVPE. The MOVPE was carried out under the following conditions.

Figure 18:
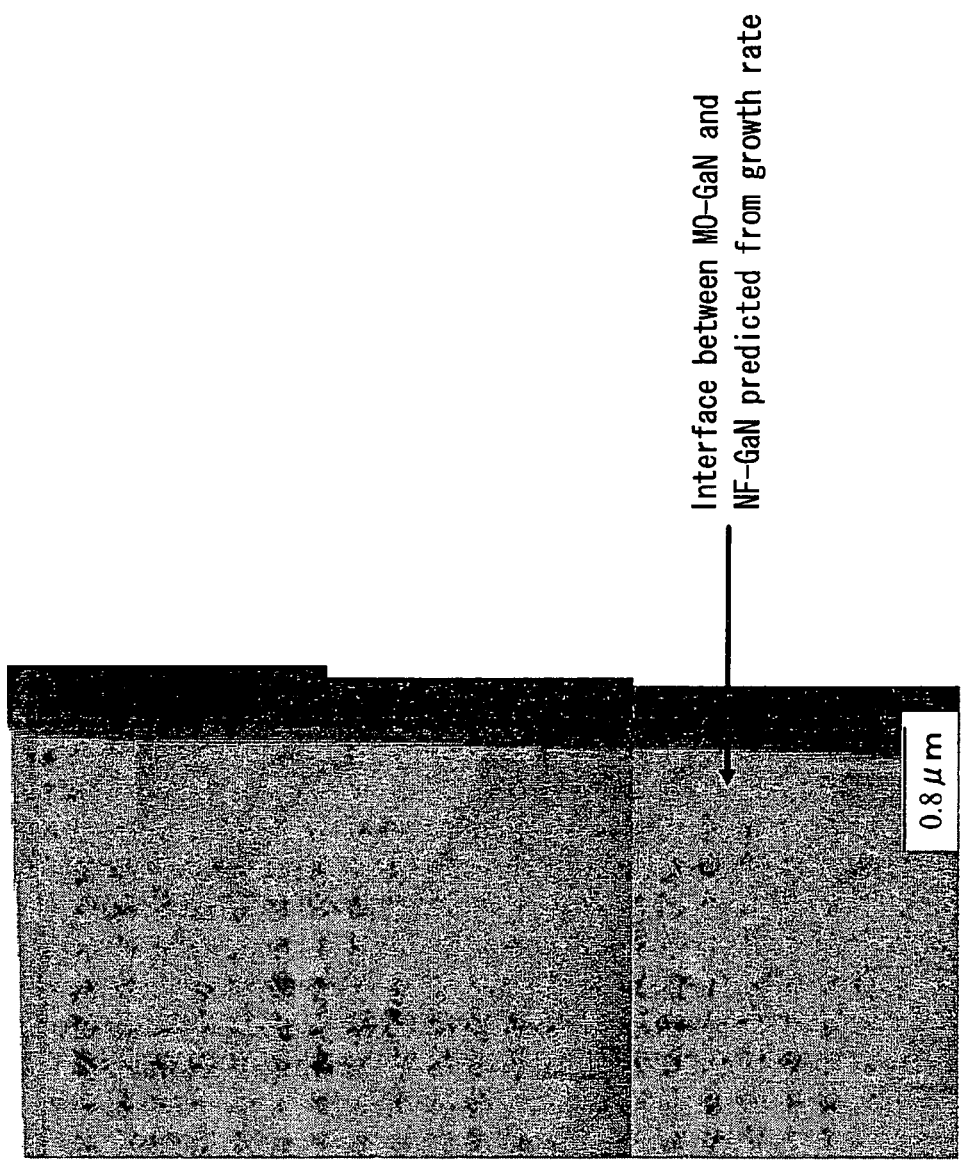
FIG. 18 is a TEM photograph showing a cross section of a GaN single crystal thin film produced by MOVPE in still another example of a production method according to the present invention.

(Conditions for MOVPE)
 Gas: $Ga(CH_3)_3$, $NH_3$, $H_2$
 Growth temperature: 1100° C.
 Growth thickness: about 2 μm The cross section of the GaN thin film obtained by the above-described MOVPE was examined with a transmission electron microscope (TEM). As a result, as shown in a TEM photograph of FIG. 18, it was confirmed that the GaN single crystal thin film formed by the MOVPE was present on the GaN single crystal formed using the Na flux. Also, an interface between both the GaN single crystals was confirmed.

Figure 19:
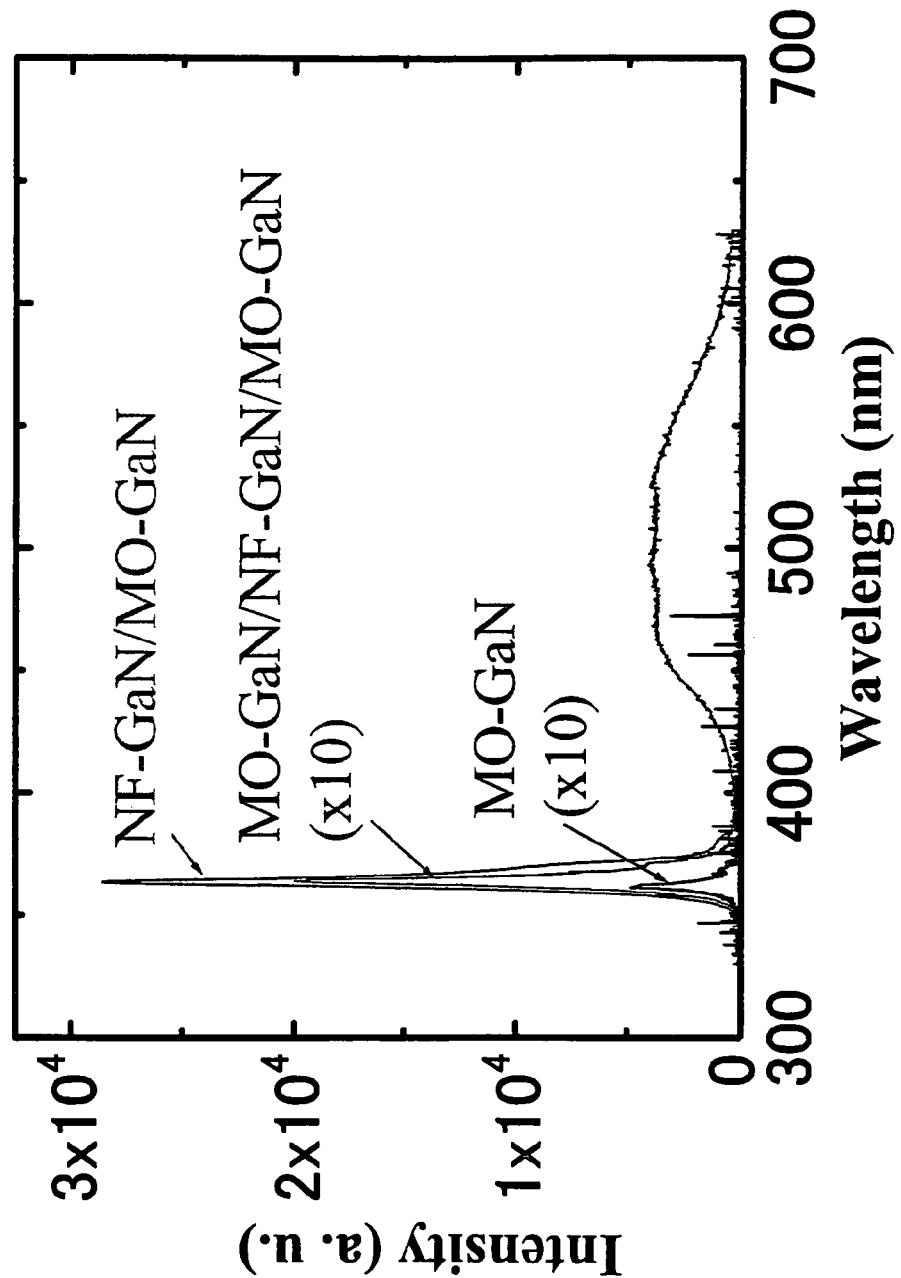
FIG. 19 shows the result of PL measurement performed with respect to the GaN single crystal thin film produced by MOVPE in the example shown in FIG. 18.

Next, PL measurement was performed with regard to the GaN (MO-GaN/NF—GaN/MO-GaN) obtained as a result of the above-described MOVPE. Conditions for the PL measurement were the same as those in Example 10. Furthermore, as controls, the PL measurement also was performed with regard to a GaN single crystal thin film (MO-GaN) formed by the MOVPE on the same sapphire substrate as used in the present example and GaN single crystal (NF—GaN/MO-GaN) formed thereon using a flux containing Na alone. The results are shown in the graph of FIG. 19. As shown in FIG. 19, the GaN single crystal (MO-GaN/NF—GaN/MO-GaN) formed by the MOVPE on the GaN single crystal (NF—GaN/MO-GaN) formed using the Na flux exhibited a PL intensity 4 times as high as that of the GaN single crystal thin film (MO-GaN) formed on the sapphire substrate. From this result, it can be said that when GaN single crystal obtained by the method using a Na flux according to the present invention is used as a substrate, it is possible to form a high-quality GaN single crystal thin film on the substrate by MOVPE.

INDUSTRIAL APPLICABILITY

As specifically described above, the gallium nitride single crystal according to the present invention is bulk-sized large transparent single crystal that is of high quality. Thus, the gallium nitride single crystal of the present invention has extremely high practical value.

The invention claimed is:

1. A method for producing Group-III-element nitride single crystal, comprising:
reacting at least one Group III element selected from the group consisting of gallium (Ga), aluminum (Al), and indium (In) with nitrogen (N) in a mixed flux containing sodium (Na) and at least one of an alkali metal (other than Na) and an alkaline-earth metal, thereby causing Group-III-element nitride single crystal to grow,
wherein a ratio of the alkali metal (other than Na) and the alkaline-earth metal to a total of the sodium (Na), the alkali metal (other than Na), and the alkaline-earth metal is in a range from 0.1 to 30 mol %.

2. The method according to claim 1, wherein the Group III element is gallium (Ga), and the Group-III-element nitride single crystal is gallium nitride (GaN) single crystal.

3. The method according to claim 1, wherein the mixed flux is a mixed flux of sodium (Na) and calcium (Ca).

4. The method according to claim 1, wherein the mixed flux is a mixed flux of sodium (Na) and lithium (Li).

5. The method according to claim 1, wherein the mixed flux is a mixed flux of sodium (Na), calcium (Ca), and lithium (Li).

6. The method according to claim 1, wherein the reaction is carried out under conditions of a temperature of 100° C. to 1200° C. and a pressure of 100 Pa to 200 MPa.

7. The method according to claim 1, wherein nitrogen (N) containing gas is used as a nitrogen source.

8. The method according to claim 7, wherein the nitrogen (N) containing gas is at least one selected from the group consisting of nitrogen ($N_2$) gas, ammonia ($NH_3$) gas, and a mixed gas containing the nitrogen ($N_2$) gas and the ammonia ($NH_3$) gas.

9. The method according to claim 1, wherein the single crystal is transparent.

10. The method according to claim 1, wherein a Group-III-element nitride is provided beforehand, and the Group-III-element nitride is brought into contact with the mixed flux to cause new Group-III-element nitride single crystal to grow using the Group-III-element nitride as a nucleus.

11. The method according to claim 10, wherein the the Group-III-element nitride that serves as the nucleus is single crystal or amorphous.

12. The method according to claim 10, wherein the Group-III-element nitride that serves as the nucleus is in a form of a thin film.

13. The method according to claim 12, wherein the thin film is formed on a substrate.

14. The method according to claim 10, wherein a nitride is present in the mixed flux at least at an initial stage of the reaction.

15. The method according to claim 14, wherein the nitride is at least one selected from the group consisting of $Ca_3N_2$, $Li_3N$, $NaN_3$, BN, $Si_3N_4$, and InN.

16. The method according to claim 1, wherein the mixed flux contains an impurity as a dopant.

17. The method according to claim 16, wherein the impurity is at least one selected from the group consisting of carbon (C), oxygen (O), silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), and germanium (Ge).

18. Group-III-element nitride single crystal obtained by the method according to claim 1,
wherein the single crystal is transparent and has a dislocation density of $10^5/cm^2$ or less.

19. Group-III-element nitride single crystal obtained by the method according to claim 1,
wherein the single crystal is transparent and has a maximum diameter of at least 2 cm.

20. A semiconductor device comprising a semiconductor layer,
wherein the semiconductor layer is formed of the Group III-element nitride transparent single crystal according to claim 18.

21. The method according to claim 1, wherein the mixed flux is a mixed flux of sodium (Na) and alkali metal other than Na.

22. The method according to claim 1, wherein the mixed flux is a mixed flux of sodium (Na) and calcium (Ca), and the growth of the single crystal is performed at a pressure of 1.5 to 3 MPa.

23. A semiconductor device comprising a Group III-element nitride thin film that is grown by using Group-III-element nitride transparent single crystal according to claim 18 as a substrate.

24. The method according to claim 3, wherein sodium and calcium are blended, so that a mole ratio of sodium to calcium is in a range of 9.75:0.25 to 7:3 with respect to 1 g of the Group III-element.

* * * * *